United States Patent
Zhang et al.

(10) Patent No.: US 11,031,378 B2
(45) Date of Patent: Jun. 8, 2021

(54) SEMICONDUCTOR DEVICE INCLUDING HIGH SPEED HETEROGENEOUS INTEGRATED CONTROLLER AND CACHE

(71) Applicant: WESTERN DIGITAL TECHNOLOGIES, INC., San Jose, CA (US)

(72) Inventors: Yazhou Zhang, Shanghai (CN); Chin-Tien Chiu, Taichung (TW); Zengyu Zhou, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/818,290

(22) Filed: Mar. 13, 2020

(65) Prior Publication Data

US 2020/0411479 A1    Dec. 31, 2020

(30) Foreign Application Priority Data

Jun. 28, 2019   (CN) .......................... 201910575625.3

(51) Int. Cl.
*H01L 25/065*   (2006.01)
*H01L 23/00*   (2006.01)

(52) U.S. Cl.
CPC .......... *H01L 25/0657* (2013.01); *H01L 24/05* (2013.01); *H01L 24/13* (2013.01); *H01L 2225/06541* (2013.01); *H01L 2924/1433* (2013.01)

(58) Field of Classification Search
CPC combination set(s) only.
See application file for complete search history.

(56) References Cited

U.S. PATENT DOCUMENTS

| | | | |
|---|---|---|---|
| 2009/0146189 A1* | 6/2009 | Madurawe | H01L 21/28008 257/203 |
| 2013/0049225 A1 | 2/2013 | Kang et al. | |
| 2013/0159757 A1* | 6/2013 | Park | G06F 1/3275 713/400 |
| 2018/0046231 A1* | 2/2018 | Raghu | G06F 3/0653 |
| 2018/0129431 A1* | 5/2018 | Yang | G11C 16/26 |
| 2018/0341431 A1 | 11/2018 | Hirobe | |
| 2019/0050325 A1* | 2/2019 | Malladi | H01L 25/18 |
| 2019/0243772 A1* | 8/2019 | Roberts | G06F 3/0608 |
| 2019/0286566 A1* | 9/2019 | Lee | G11C 7/1096 |
| 2020/0243154 A1* | 7/2020 | Sity | G11C 29/38 |
| 2020/0243486 A1* | 7/2020 | Quader | G06N 3/063 |
| 2020/0411480 A1* | 12/2020 | Yang | H01L 25/50 |
| 2021/0026557 A1* | 1/2021 | Cariello | G06F 3/0673 |

FOREIGN PATENT DOCUMENTS

| | | |
|---|---|---|
| EP | 2672511 | 12/2013 |
| WO | 2014120215 | 8/2014 |

\* cited by examiner

*Primary Examiner* — Mamadou L Diallo
(74) *Attorney, Agent, or Firm* — Vierra Magen Marcus LLP

(57) ABSTRACT

A semiconductor device is disclosed including a controller die and a memory module. The controller die may be a heterogeneous integrated controller die having ASIC logic circuits, memory array logic circuits and a cache structure. In examples, the memory module may have continuously formed through silicon vias in a face-up or face-down configuration.

20 Claims, 14 Drawing Sheets

SEMICONDUCTOR DEVICE INCLUDING HIGH SPEED HETEROGENEOUS INTEGRATED CONTROLLER AND CACHE

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and solid state drives.

Recently, ultra high density memory devices have been proposed using a 3D stacked memory structure having strings of memory cells formed into layers. One such storage device is sometimes referred to as a Bit Cost Scalable (BiCS) architecture. In addition to the layered memory cells, 3D memory devices include a logic circuit for controlling read/write to the memory cells. The logic circuit, often fabricated using complementary metal-oxide-semiconductor (CMOS) technology, may typically be formed beneath stacked memory layers within a semiconductor wafer.

There is currently a significant push to use flash memory devices as solid state drive (SSDs) in datacenters. As the number of memory layers in 3D memory structures increases to meet ever growing datacenter memory demands, it is becoming harder to position the logic circuit beneath the 3D memory cell structure. Additionally, process parameters which are optimized for the memory array formation may not be optimized for the logic circuit formation. For example, it is known heat the 3D memory cell structure in a variety of fabrication steps. While advantageous for the memory cell structure, the heat can adversely affect the operation of the logic circuit.

DETAILED DESCRIPTION

Figure 1:
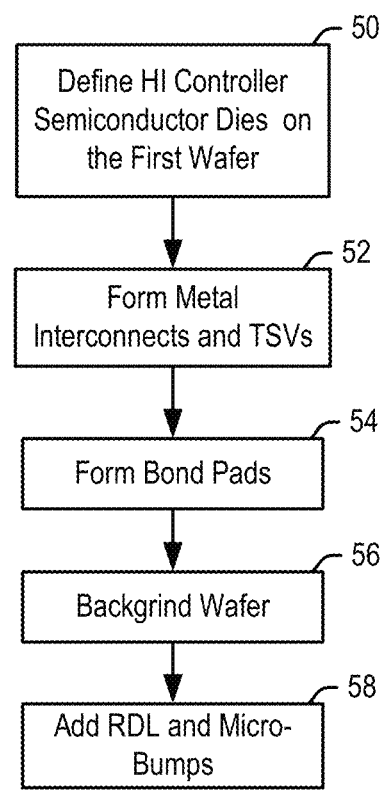
FIG. 1 is a flowchart for forming a first wafer including controller dies according to embodiments of the present technology.

The present technology will now be described with reference to the figures, which, in embodiments, relate to a semiconductor device including one or more memory array semiconductor dies and a controller die including heterogeneous integrated ASIC logic circuits, memory array logic circuits and a cache structure. The ASIC logic circuits of the controller die performs memory management and acts as an interface with a host device. The memory array logic circuits of the controller die includes sensor amplifier and peripheral functions, and acts as an interface with the memory arrays of the memory array wafer dies. The cache structure may be positioned between the ASIC logic circuits and memory array logic circuits to provide temporary storage for active data. As opposed to accessing the memory array semiconductor dies, the ASIC logic circuits may read active data from and/or write active data to the cache structure to shorten access times, reduce latency and improve input/output (I/O).

In embodiments, the memory array semiconductor dies may be stacked and electrically coupled to each other using "continuously formed" through silicon vias (TSVs), meaning the holes for the TSVs are formed in a single process through each of the memory array semiconductor dies in the stack of dies. The memory array stack may either have a "face-up" TSV configuration or a "face-down" TSV configuration. In the face-up TSV configuration, electrical connectors may be formed at a bottom of the die stack, and in the face-up TSV configuration, the electrical connectors may be formed at a top of the die stack. As compared with traditional TSV technology, both the face-up and face-down TSV configurations they omit several processes, such as via etching for each wafer, seed layer deposition, isolation layer fabrication on each backside of grinded wafer, both side copper bump fabrication, die level bump bonding and underfill filling between dies.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±2.5% of a given dimension.

Figure 2:
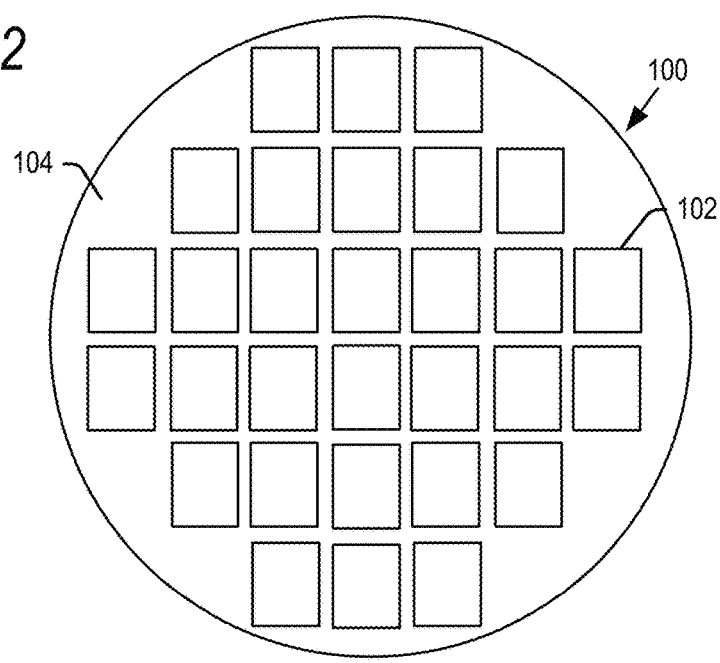
FIG. 2 is a top view of a first major surface of a first semiconductor wafer including controller dies according to embodiments of the present technology.
Figure 3:
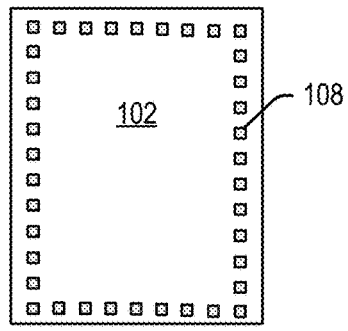
FIG. 3 is a top view of a controller die of the first semiconductor wafer according to embodiments of the present technology.
Figure 4:
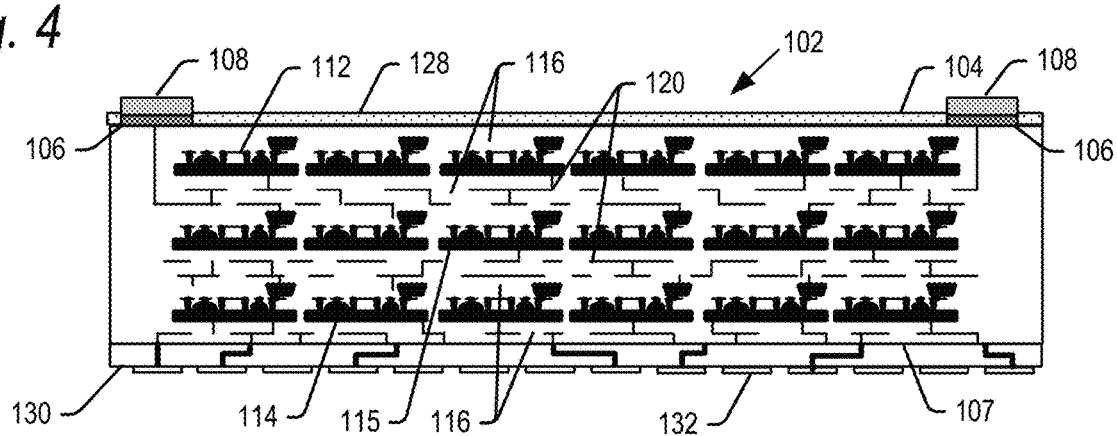
FIG. 4 is a cross-sectional edge view of a controller die of the first semiconductor wafer according to embodiments of the present technology.

An embodiment of a first wafer including controller semiconductor dies will now be explained with reference to the flowchart of FIG. 1, and the views of FIGS. 2-5. In step 50, a first semiconductor wafer 100 may be processed into a number of first semiconductor dies 102 as shown in FIGS. 2-4. These first semiconductor dies 102 may also be referred to herein as heterogeneous integrated controller dies 102, or simply controller dies 102. The first wafer 100 may also be referred to herein as a heterogeneous integrated controller wafer 100, or simply controller wafer 100. The first semiconductor wafer 100 may start as an ingot of wafer material which may be monocrystalline silicon grown according to either a Czochralski (CZ) or floating zone (FZ) process. However, first wafer 100 may be formed of other materials and by other processes in further embodiments.

The controller wafer 100 may be cut from the ingot and polished on both the first major planar surface 104, and second major planar surface 107 (FIG. 4) opposite surface 104, to provide smooth surfaces. The first major surface 104 may undergo various processing steps to divide the wafer 100 into the respective first semiconductor dies 102, and to form integrated circuits of the respective first semiconductor dies 102 on and/or in the first major surface 104.

In particular, in step 50, the first semiconductor dies 102 may be processed in embodiments to include ASIC logic circuits 112, memory array logic circuits 114 and a cache structure 115 formed in a dielectric substrate including layers 116 as shown in FIG. 4. FIG. 4 illustrates a cross-section of a single die 102 representative of all dies 102 on the first wafer 100. Further detail of the ASIC logic circuits 112, memory array logic circuits 114 and cache structure 115 are described below with reference to FIG. 5, but in general, the ASIC logic circuits 112 perform memory management and act as an interface to control the exchange of data with a host device. The memory array logic circuits 114 include sensor amplifier (SA) and peripheral (peri) circuits which function as toggle mode interface circuits in order to decode Bitline/Wordline to buffer, and then transfer data between the memory arrays (explained below) and the ASIC logic circuits 112. The cache structure 115 may provide temporary storage for the ASIC logic circuits to shorten access times, reduce latency and improve input/output (I/O).

In embodiments, the ASIC logic circuits 112, memory array logic circuits 114 and cache structure 115 may each be fabricated in respective dielectric layers 116 of wafer 100, with the cache structure 115 sandwiched below the ASIC logic circuits 112 and above the memory array logic circuits 114 (from the perspective of FIG. 4). The logic circuits 112, 114 may be fabricated using CMOS technology, though the logic circuits may be fabricated using other technologies in further embodiments. The controller semiconductor dies 102 may include other and/or additional integrated circuits in further embodiments as explained below.

In step 52, multiple layers of metal interconnects and vias 120 may be formed in and through the layers of the semiconductor die 102. These metal interconnects and vias 120 may electrically couple the ASIC logic circuits 112 and memory array logic circuits 114, and the ASIC logic circuits 112 and cache structure 115.

A passivation layer 128 may be formed on top of the dielectric film layer 116. In step 54, bond pads 108 (FIGS. 3 and 4) may be formed on the passivation layer 128, coupled to the TSVs 120a. The bond pads 108 may be formed over a liner 106. As is known in the art, the bond pads 108 may be formed for example of copper, aluminum and alloys thereof, and the liner 106 may be formed for example of a titanium/titanium nitride stack such as for example Ti/TiN/Ti, though these materials may vary in further embodiments. The bond pads 108 and liners 106 together may have a thickness of 720 nm, though this thickness may be larger or smaller in further embodiments.

In step 56, the controller wafer 100 may be thinned in a backgrind process to define the second major planar (inactive) surface 107 of wafer 100. In step 58, a redistribution layer (RDL) 130 may be formed on the second major planar surface 107 as shown in FIG. 4. The RDL 130 may electrically connect select ones of the bond pads 108 and TSVs 120a to a pattern of micro-bumps 132 distributed across the RDL 130. The micro-bumps 132 can be Cu, AgSn or other metal which can bond between two wafers. The height of the micro-bumps 132 may be about 1 μm to 50 μm, though they may be thinner or thicker than that in further embodiments. The metal interconnects and vias 120 may be used to transfer signals and currents between the die bond pads 108 and the ASIC logic circuits 112 between the ASIC logic circuits 112 and cache structure 115, between ASIC logic circuits 112 and the memory array logic circuits 114, and between the memory logic circuits 114 and micro-bumps 132.

The number and pattern of semiconductor dies 102 shown on wafer 100 in FIG. 2 is by way of example only. Wafer 100 may include more first semiconductor dies 102, and in different patterns, in further embodiments. Similarly, FIGS. 3 and 4 include a pattern of bond pads 108 on one of the semiconductor dies 102, around a periphery of the semiconductor die 102. However, the pattern of bond pads 108, as well as the number of bond pads 108, on the first semiconductor die 102 in FIGS. 3 and 4 may vary in further embodiments.

Figure 5:
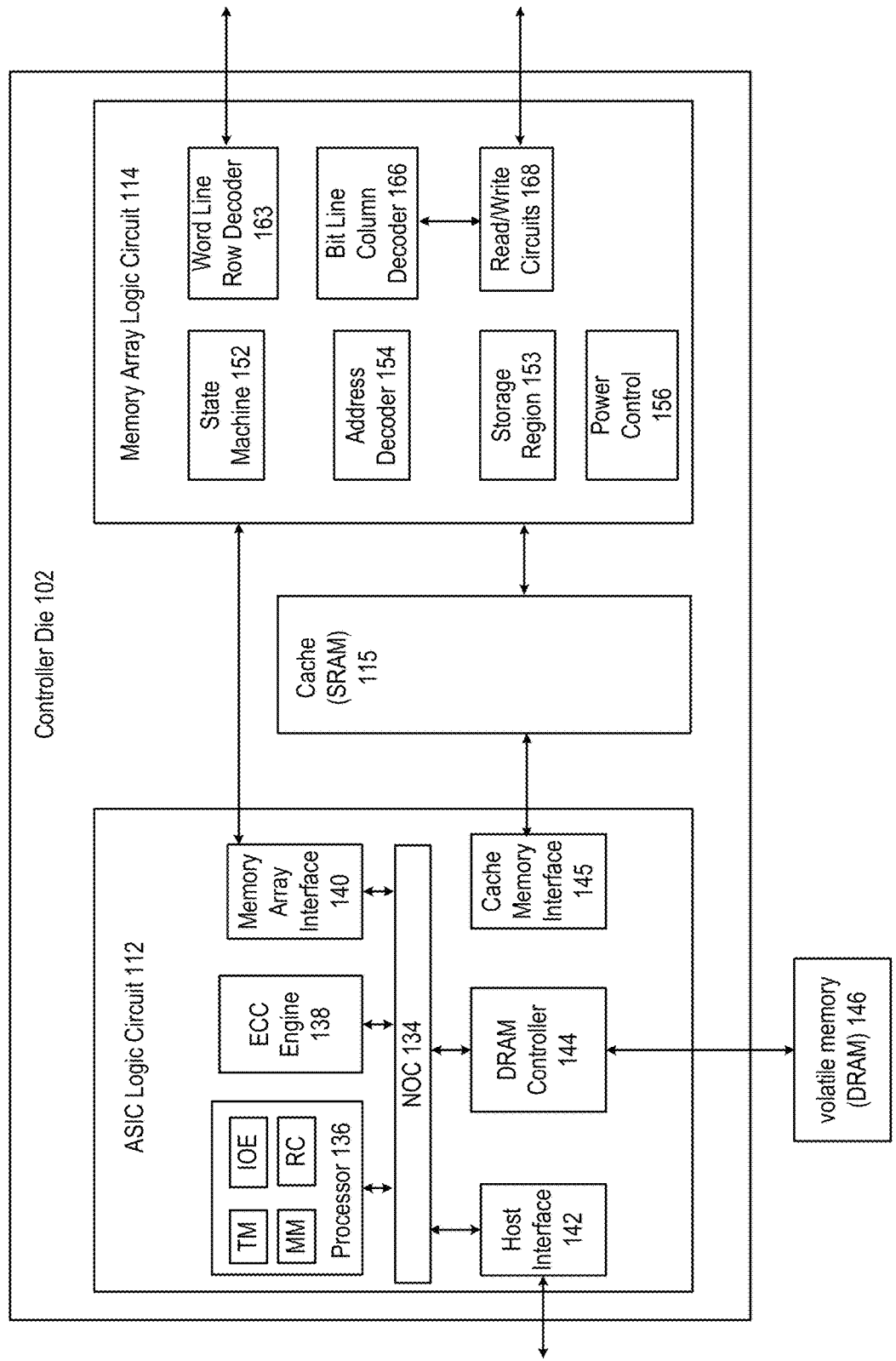
FIG. 5 is a schematic block diagram of a controller die according to embodiments of the present technology.
Figure 26:
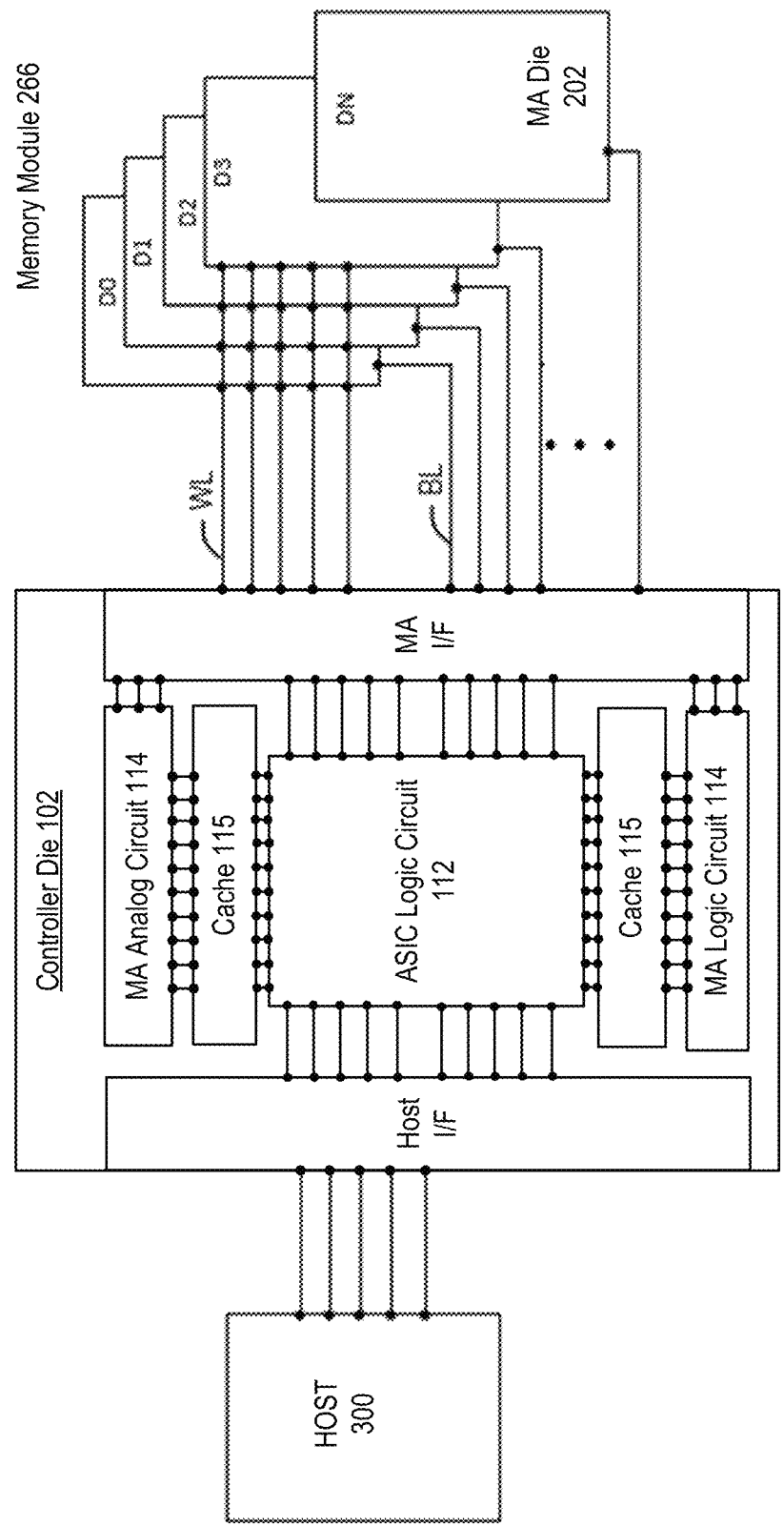
FIG. 26 is a functional block diagram of a semiconductor device according to embodiments of the present technology.

FIG. 5 is a schematic block diagram showing further detail of the ASIC logic circuit 112, memory array logic circuit 114 and cache structure on a controller die 102. The ASIC logic circuit 112 comprises a host interface 142 that is connected to and in communication with a host device 300 (FIG. 26). In one embodiment, host interface 142 provides a PCIe interface. Other interfaces can also be used, such as SCSI, SATA, etc. Host interface 142 is also connected to a network-on-chip (NOC) 134. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 134 are processor 136, ECC engine 138, memory interface 140, and DRAM controller 144. The DRAM controller 144 is used to operate and communicate with local high speed volatile memory 146 (e.g., DRAM). In other embodiments, local high speed volatile memory 146 can be SRAM or another type of volatile memory.

ECC engine 138 performs error correction services. For example, ECC engine 138 performs data encoding and decoding, as per the implemented ECC technique. In one embodiment, ECC engine 138 is an electrical circuit programmed by software. For example, ECC engine 138 can be a processor that can be programmed. In other embodiments, ECC engine 138 is a custom and dedicated hardware circuit without any software. In another embodiment, the function of ECC engine 138 is implemented by processor 136.

Processor 136 performs the various memory operations. For example, memory array module (MM) is a module/process running on processor 136 for performing programming, erasing, reading, as well as memory management processes. Read calibration manager (RC) is a module/process running on processor 136 for performing read calibration processes. In one embodiment, read calibration manager (RC) is implemented as part of ECC Engine 138. Indication of error manager (IOE) is a module/process running on processor 136 for calculating an indication of error, which is used for the calibration of read reference levels. In one embodiment, indication of error manager (IOE) is implemented as part of ECC Engine 138 or as part of read calibration manager (RC).

In one embodiment, processor 136 is programmed by firmware such that read calibration manager (RC) and indication of error manager (IOE) are firmware/software. In other embodiments, processor 136 is a custom and dedicated hardware circuit without any software. Processor 136 (alone or with ECC engine 138) can perform recalibration of read reference levels in order to determine updated read reference levels, including dynamically and adaptively choosing test read reference levels for sensing sample data.

Processor 136 also implements a translation module (TM), as a software/firmware process or as a dedicated hardware circuit. In many systems, the non-volatile memory is addressed internally to the storage system using physical addresses associated with the one or more memory die, discussed below. However, the host system will use logical addresses to address the various memory locations. This enables the host to assign data to consecutive logical addresses, while the storage system is free to store the data as it wishes among the locations of the one or more memory die.

Memory interface 140 communicates with the memory array logic circuit 114. The memory array 212 on the second die 202 (discussed below) may be controlled by memory array logic circuit 114 on the first die 102. The memory array logic circuit 114 may have circuitry used for accessing, controlling and driving memory elements of the memory array to accomplish functions such as programming and reading. The memory array logic circuit 114 cooperates with the read/write circuits 168 to perform memory operations on the memory array. The read/write circuits 168 may include multiple sense blocks (sensing circuitry) that allow a page of memory cells from memory array dies on the memory wafer (explained below) to be read or programmed in parallel.

In embodiments, logic circuit 114 may include a state machine 152, an address decoder 154, and a power control module 156. The state machine 152 provides chip-level control of memory operations. A storage region 153 may be provided for operating the memory array 212 such as programming parameters for different rows or other groups of memory cells. These programming parameters could include bit line voltages and verify voltages.

The address decoder 154 provides an address interface between that used by the host device or the ASIC logic circuit 112 to the hardware address used by the decoders 163 and 166. The power control module 156 controls the power and voltages supplied to the word lines and bit lines during memory operations. It can include drivers for word line layers in a 3D configuration, source side select gates, drain side select gates and source lines. A source side select gate is a gate transistor at a source-end of a NAND string, and a drain side select gate is a transistor at a drain-end of a NAND string.

The cache structure 115 may sit between the ASIC logic circuit 112 in the memory array logic circuit 114. The cache structure 115 may be organized as SRAM, though it may have other configurations in further embodiments. The cache structure 115 may perform as disc cache for the memory array 212 (explained below) and/or processor cache for the processor 136. Data can be stored on and/or read to cache structure 115 as opposed to interfacing with the memory array. This provides shorter access times, reduced latency and improved input/output (I/O). The ASIC logic circuit 112 may read data from and write data to the cache structure 115. The memory array logic circuit 114 may also read data from and write data to the cache structure 115.

In accordance with aspects of the present technology, the above-described ASIC logic circuit 112, memory array logic circuit 114 and cache structure 115 are integrated into a single semiconductor die 102, and the memory array 212 (described below) is separated out onto its own chip. However, it is understood that some of the above-described functionality of the ASIC logic circuit 112, memory array logic circuit 114 and cache 115 can be offloaded onto the memory array semiconductor die in further embodiments. Additional components and functionality may be added to the controller die 102 in further embodiments.

Figure 6:
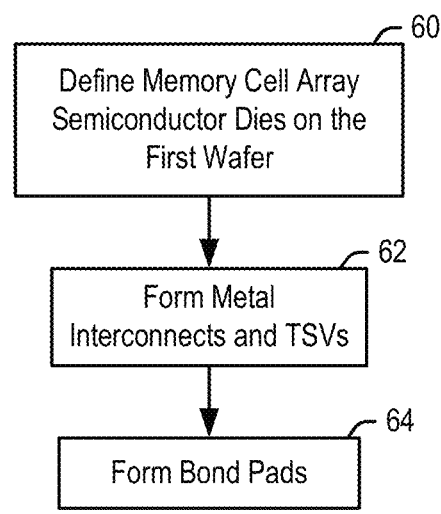
FIG. 6 is a flowchart for forming a second wafer including memory array dies according to embodiments of the present technology.

Before, after or in parallel with the formation of the controller semiconductor dies on first wafer 100, a second semiconductor wafer 200 may be processed into a number of second semiconductor dies 202. Fabrication and operation of the semiconductor dies 202 on wafer 200 will now be explained with reference to the flowchart of FIG. 6 and the views of FIGS. 7-9.

Figure 7:
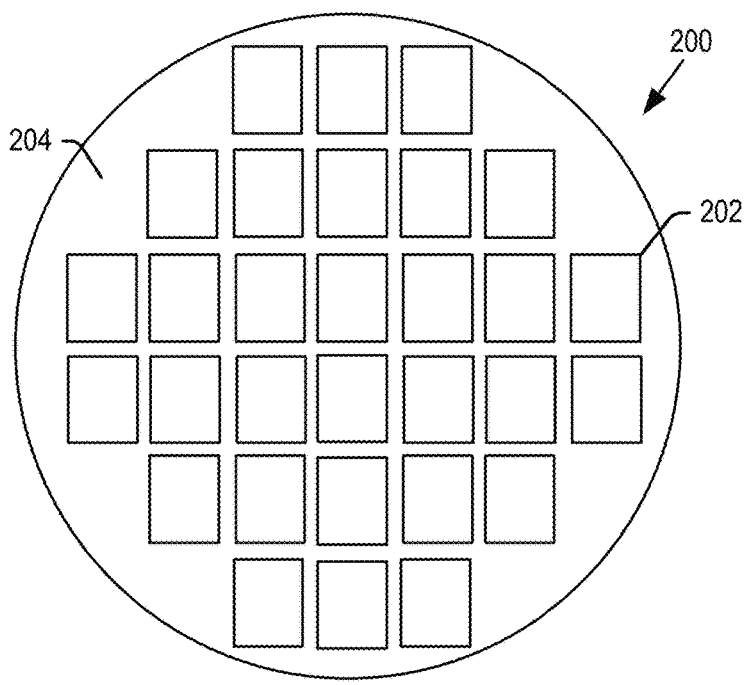
FIG. 7 is a top view of a first major surface of a second semiconductor wafer including memory array dies according to embodiments of the present technology.
Figure 8:
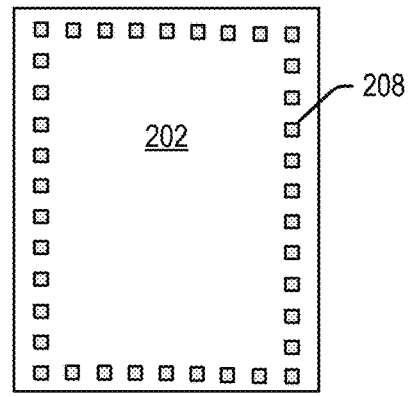
FIG. 8 is a top view of a memory array die of the second semiconductor wafer according to embodiments of the present technology.

FIG. 7 shows a top view of the second semiconductor wafer 200. The second semiconductor wafer 200 may start as an ingot of monocrystalline silicon grown according to either a CZ, FZ or other process. The second semiconductor wafer 200 may be cut and polished on both the first major surface 204, and second major surface 207 (FIG. 9) opposite surface 204, to provide smooth surfaces. The first major surface 204 may undergo various processing steps to divide the second wafer 200 into the respective second semiconductor dies 202, and to form integrated circuits of the respective second semiconductor dies 202 on and/or in the first major surface 204. These second semiconductor dies 202 may also be referred to herein as memory array dies 202, and the second wafer 200 may also be referred to herein as a memory array wafer 200.

Figure 9:
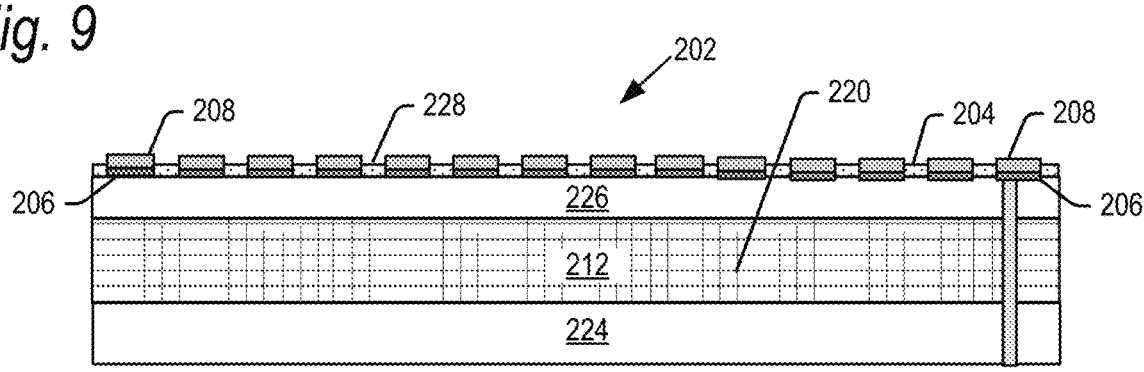
FIG. 9 is a cross-sectional edge view of a memory array die of the second semiconductor wafer according to embodiments of the present technology.

In one embodiment, the memory array dies 202 may be processed in step 60 to include memory array 212 formed in a dielectric substrate including layers 224 and 226 as shown in FIG. 9. FIG. 9 illustrates a cross-section of a single die 202 representative of all dies 202 on wafer 200. Further details of the memory array 212 are provided below, but in general, the memory array 212 may be formed as a 3D stacked memory structure having strings of memory cells formed into layers. However, it is understood that the second semiconductor dies 202 may be processed to include integrated circuits other than a 3D stacked memory structure.

In step 62, multiple layers of metal interconnects and vias 220 may be formed in and through the dielectric layers 226 of the semiconductor die 202. A passivation layer 228 may be formed on top of the dielectric film layer 226. In step 64, bond pads 208 (FIGS. 8 and 9) may be formed through the passivation layer 228, coupled to the metal interconnects and vias 220. The bond pads 208 may be formed over a liner 206. As noted above for pads 108, the bond pads 208 may be formed for example of copper, aluminum and alloys thereof, and the liner 206 may be formed for example of a titanium/titanium nitride stack such as for example Ti/TiN/Ti, though these materials may vary in further embodiments. The bond pads 208 and liners 206 together may have a thickness of 720 nm, though this thickness may be larger or smaller in further embodiments.

The number and pattern of semiconductor dies 202 shown on wafer 200 in FIG. 7 is by way of example only. Wafer 200 may include more memory array semiconductor dies 202, and in different patterns, in further embodiments. Similarly, FIGS. 8 and 9 include a pattern of bond pads 208 on one of the semiconductor dies 202, around a periphery of the semiconductor die 202. However, the pattern of bond pads 208, as well as the number of bond pads 208, on the second semiconductor die 202 in FIGS. 8 and 9 may vary in further embodiments.

The dies 202 of the memory array wafer 200 may each include a memory structure of memory cells, such as an array of memory cells. The array of memory cells 212 (FIG. 9) is addressable by word lines via the row decoder 163 (FIG. 5) and by bit lines via the column decoder 166 from the controller dies 102 on the controller wafer 100. Multiple memory elements in memory array may be configured so that they are connected in series or so that each element is individually accessible. By way of non-limiting example, flash memory systems in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements of memory array may be configured so that each element is individually accessible, e.g., a NOR memory array. NAND and NOR memory configurations are exemplary, and memory elements may be otherwise configured.

The memory array 212 can be two-dimensional (2D) or three-dimensional (3D). The memory array 212 may comprise one or more arrays of memory elements (also referred to as memory cells). A 3D memory array is arranged so that memory elements occupy multiple planes or multiple memory device levels, thereby forming a structure in three dimensions (i.e., in the x, y and z directions, where the z direction is substantially perpendicular, and the x and y directions are substantially parallel, to the major planar surfaces 204, 207 of the memory array dies 202).

Figure 10:
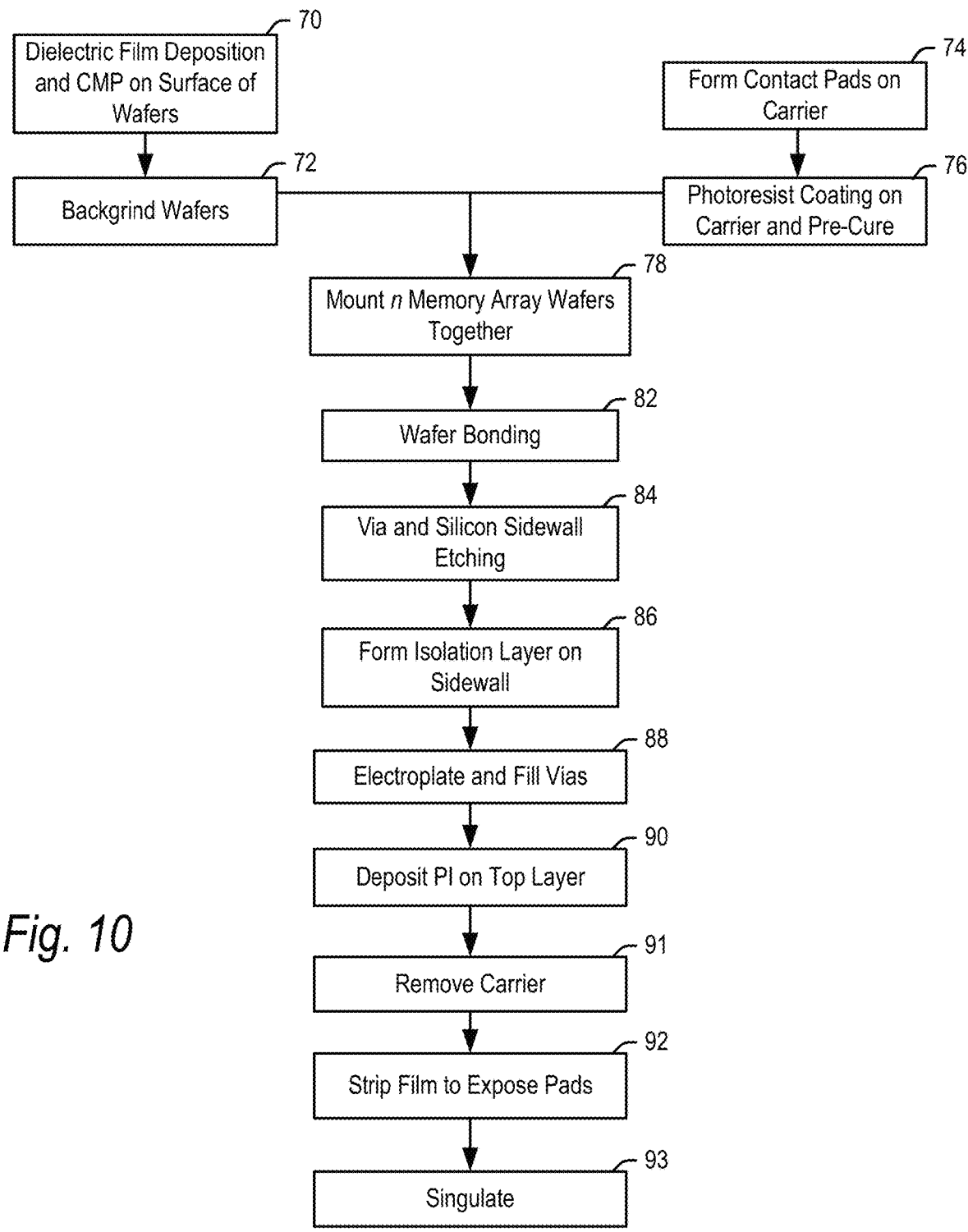
FIG. 10 is a flowchart for forming a "face-up" semiconductor device according to embodiments of the present technology.

In accordance with aspects of the present technology, one or more memory array wafers 200 may be stacked together to form a memory array die stack. A first embodiment including a face-up TSV memory array die stack will initially be described with reference to the flowchart of FIG. 10 and the views of FIGS. 11-20. A second embodiment including a face-down TSV memory array die stack will then be described with reference to the flowchart of FIG. 21 and the views of FIGS. 22-23.

Figure 11:
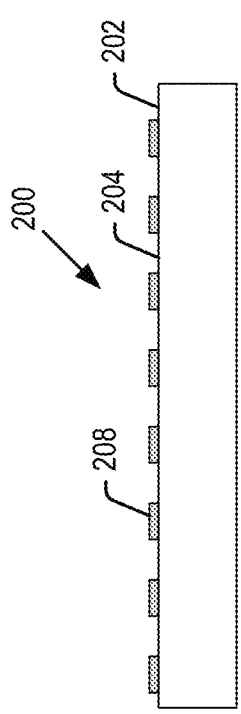
FIGS. 11-13 are edge views showing preparation of a memory array semiconductor die for stacking together according to embodiments of the present technology.
Figure 12:
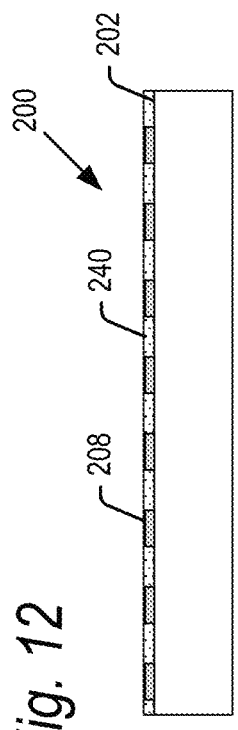
Figure 13:
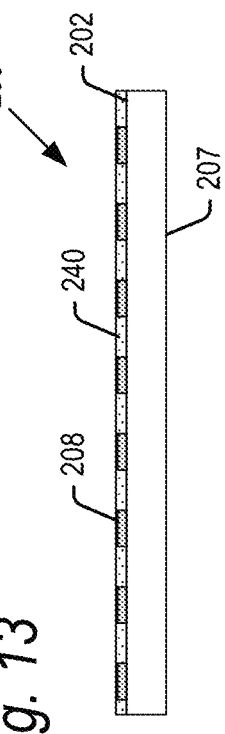

In step 70, a number of memory array wafers 200 may be processed for stacking by depositing a dielectric film over the active surface 204 to embed the contact pads 108. The dielectric film may be silicon nitride, though it may be other materials in further embodiments. Step 70 may further include a CMP polishing process may be performed for surface planarization. FIG. 11 shows a semiconductor die 202 of the memory array wafer 200 including bond pads 208 on active service 204, and FIG. 12 shows the active surface 204 after application and polishing of the dielectric film layer 240. In step 72, the memory array wafer 200 may be thinned in a backgrind process to define the second major planar (inactive) surface 207 of wafer 200 as shown in FIG. 13.

Figure 14:
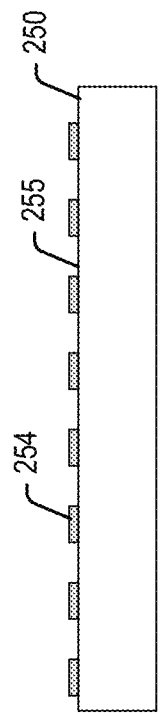
FIGS. 14-15 are edge views showing preparation of a temporary carrier on which memory array dies may be stacked according to embodiments of the present technology.
Figure 15:
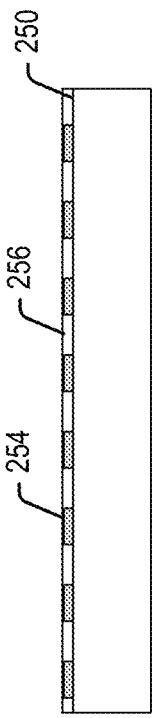

Before, during or after preparation of the second wafer 200 in steps 70 and 72, a temporary carrier may also be prepared in steps 74 and 76. An example of a temporary carrier 250 is shown in FIG. 14. The temporary carrier 250 can for example be metal, glass or silicon. In step 74, metal contact pads 254 may be formed on a major surface 255 of the temporary carrier 250. The contact pads 254 may be formed by photolithographic printing processes, plating or other known processes. A release film 256 may be applied to the major surface 255 of carrier 250 in step 76 as shown in FIG. 15. The release film 256 may be generally planar and may be to a height of the contact pads 254. The release film 256 may be cured to a B-stage in step 76. The film 256 may be a temporary adhesive, which can be dissolved or removed for example using a laser/UV light, heat, chemicals and/or force as explained below.

Figure 16:
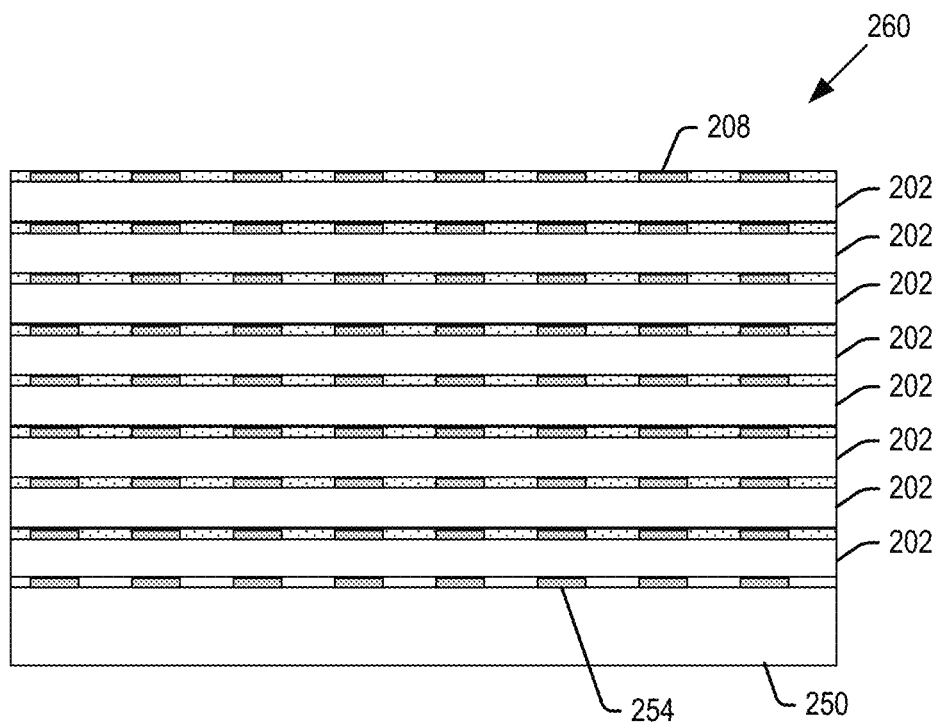
FIGS. 16-19 are edge views showing a face-up memory array wafer stack at different stages of fabrication according to embodiments of the present technology.

In step 78, a number, n, of memory array wafers 200 (including film 240) may be stacked on top of the major surface 255 of carrier 250 as shown in FIG. 16. In embodiments, there may be n total memory array wafers, where n=1, 2, 4, 8, 16, 32 or other numbers of wafers. The memory array wafers 200 may be aligned and stacked on each other such that the memory array semiconductor dies 202 of respective wafers 200 align with each other. The number of memory wafers 200 in FIG. 16 is by way of example only and may vary as noted above.

Once all of the wafers 200 have been mounted on carrier 250, the wafers 200 may be permanently bonded to each other in step 82. This permanent bonding physically attaches the wafers to each other. Various known bonding processes may be used to permanently bond the wafers to each other, such as for example fusion bonding and hybrid bonding.

Figure 17:
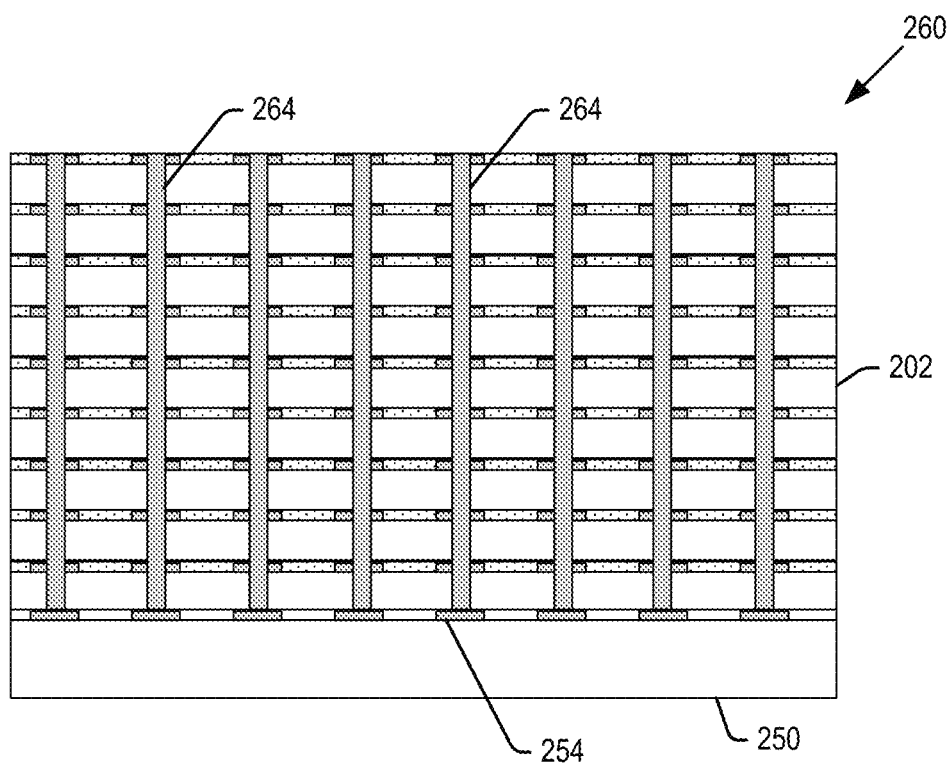

Once bonded, TSVs 264 may be formed through each of the wafers in steps 84-88 to electrically couple the bond pads 208 of respective wafers as shown in FIG. 17. In accordance with aspects of the present technology, the TSVs 264 may be 'continuously formed' through the dies 202 of the wafer stack 250, meaning the holes for the TSVs 264 are formed in a single process through each of the dies in stack 250 after the wafers are stacked together. In particular, the TSVs 264 may be formed by etching holes through the memory array semiconductor dies 202 in step 84 in the pattern of the finished TSVs 264. The silicon sidewalls of the holes may also be etched in step 84. Silicon sidewall etching structure may provide a strong pinning effect for the copper filling (explained below) between two adjacent dies for higher reliability of signal transmission. The etched holes may then be lined with an isolation layer against diffusion in step 86.

In step 88, the etched holes may then be electroplated and filled with an electrically conductive material to form the TSVs 264. The conductive material may comprise copper, although other suitable materials such as aluminum, tin, nickel, gold, doped polysilicon, and alloys or combinations thereof may be used. It is a feature of the present technology that the seed layer, conventionally formed over the isolation layer, may be omitted. In particular, as explained below, the etched holes may be plated and/or filled from the bottom up with a conductive material such as copper. Filling from the bottom up under gravity allows the seed layer to be omitted.

Figure 18:
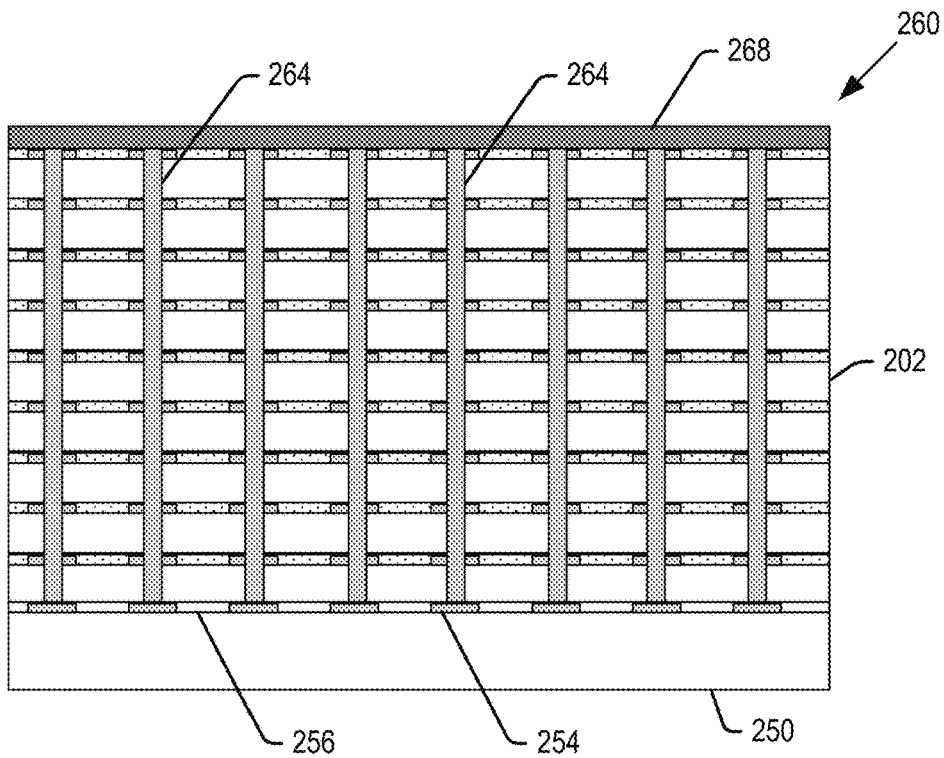
Figure 19:
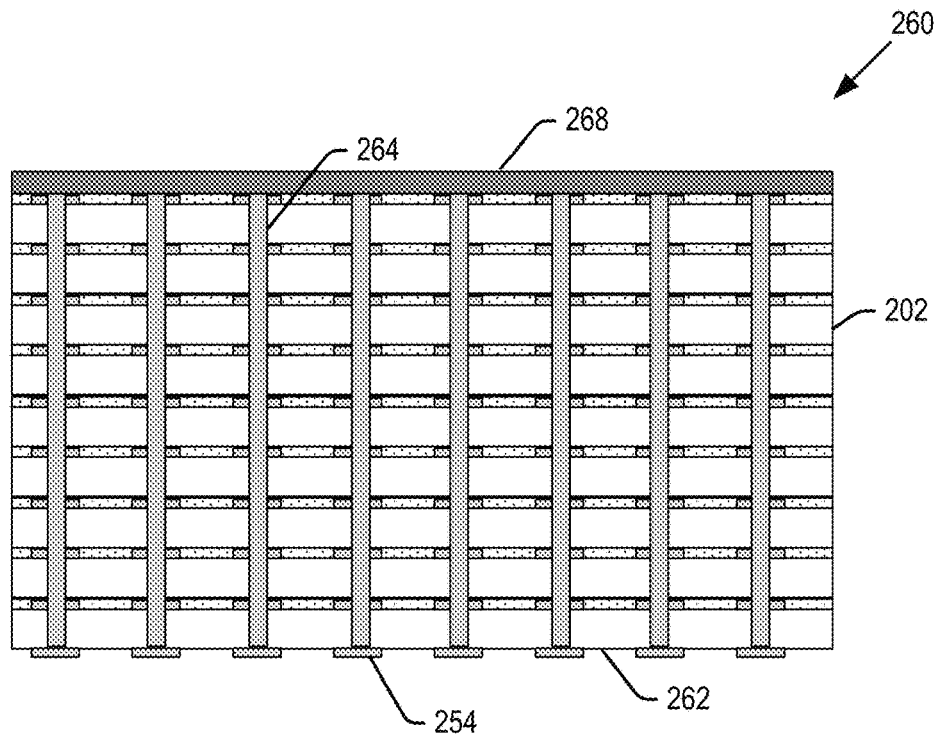

In this face-up configuration, a polyimide film 268 may next be formed on an upper surface of the wafer stack 260 in step 90 as shown in FIG. 18. The polyimide film 268 is provided to seal and protect the upper surface of the wafer stack 260. In step 91, the carrier 250 may be removed as shown in FIG. 19. In step 92, the release film 256 may be dissolved or otherwise removed as shown in FIG. 19. As shown, the contact pads 254, originally formed on carrier 250, are transferred to a lower surface 262 of the die stack 260. The contact pads 254 are left exposed with the removal of the release film 256.

Figure 20:
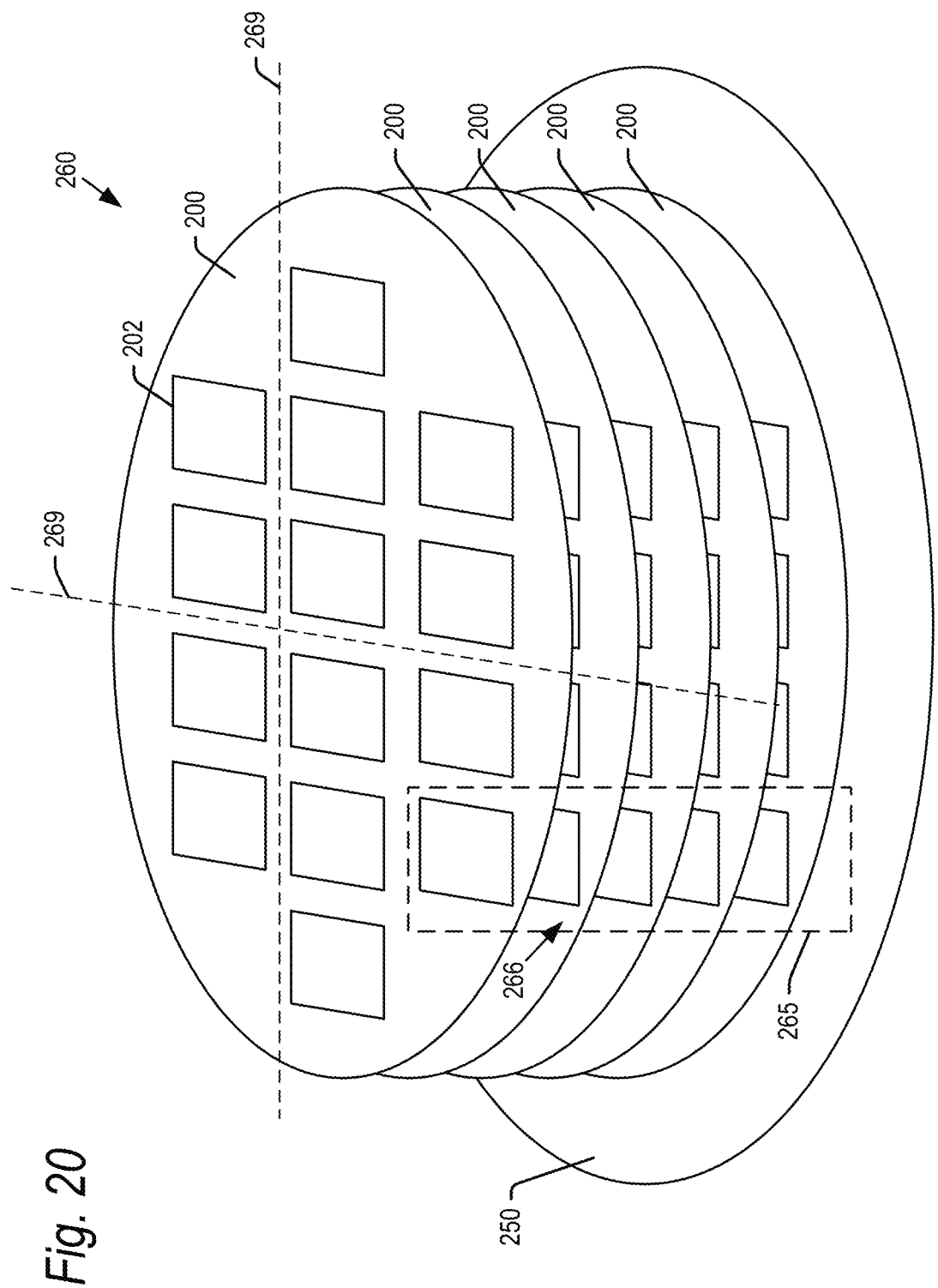
FIG. 20 is a perspective view of a completed memory array wafer stack according to embodiments of the present technology.

As noted, at this point in the fabrication, the memory array dies 202 are still part of their respective wafers 200 in stack 260 as shown for example in FIG. 20. In step 93, the stack 260 may be singulated to provide individual memory modules 266. Each memory module 266 may be a stacked and aligned column of memory array dies 202 as indicated by the dashed-line box 265 in FIG. 20. The wafer stack 260 may be singulated by cutting along kerf lines 269, two of which are indicated by dashed lines in FIG. 20. The wafer stack may be cut for example by laser, saw blade, waterjet or other means.

Figure 21:
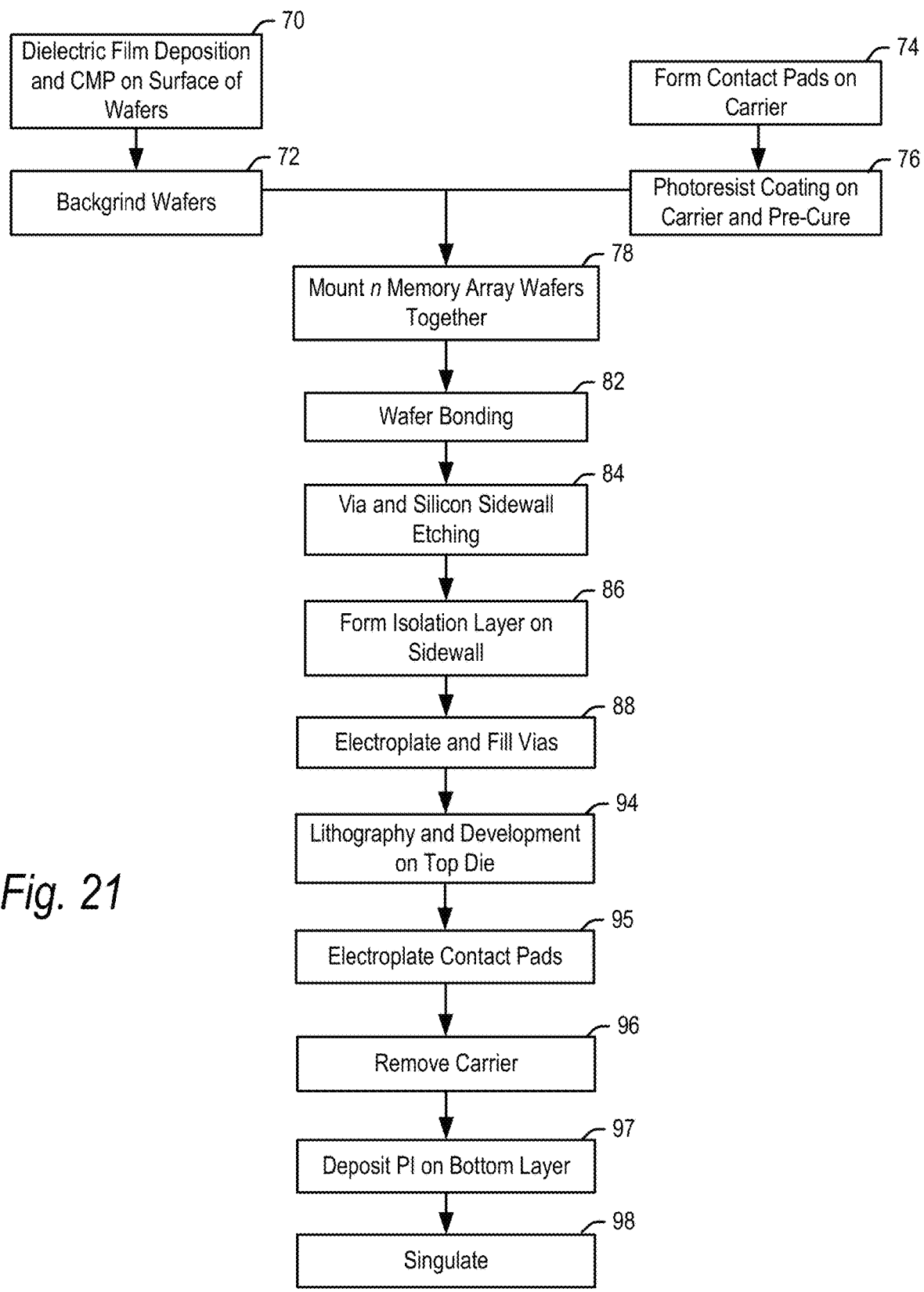
FIG. 21 is a flowchart for forming a "face-down" semiconductor device according to embodiments of the present technology.
Figure 22:
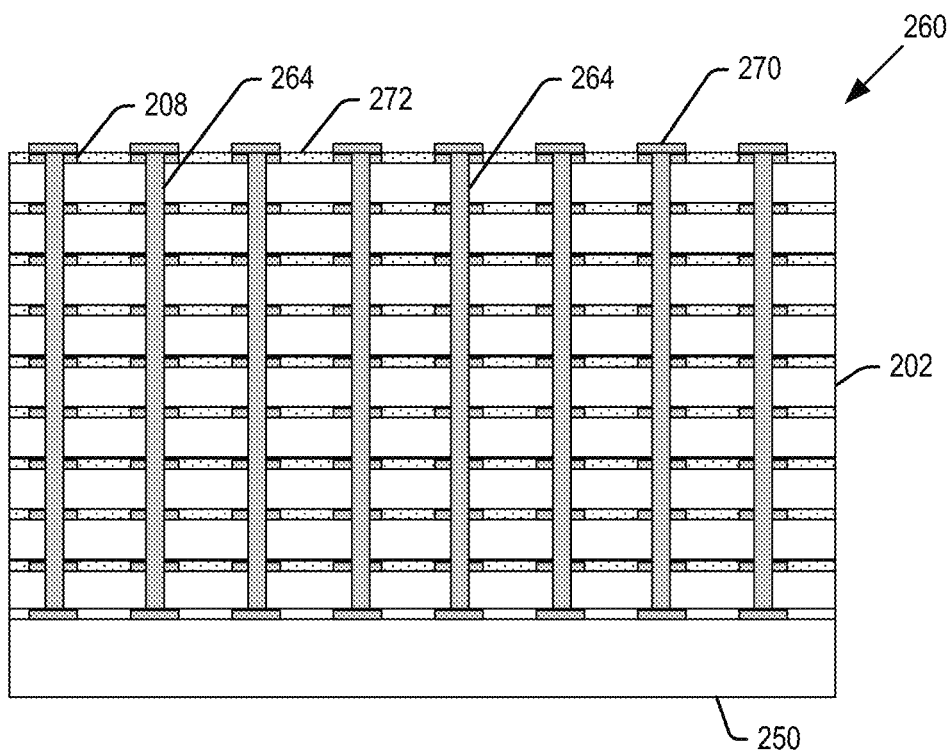
FIGS. 22-23 are edge views showing a face-down memory array wafer stack at different stages of fabrication according to embodiments of the present technology.
Figure 23:
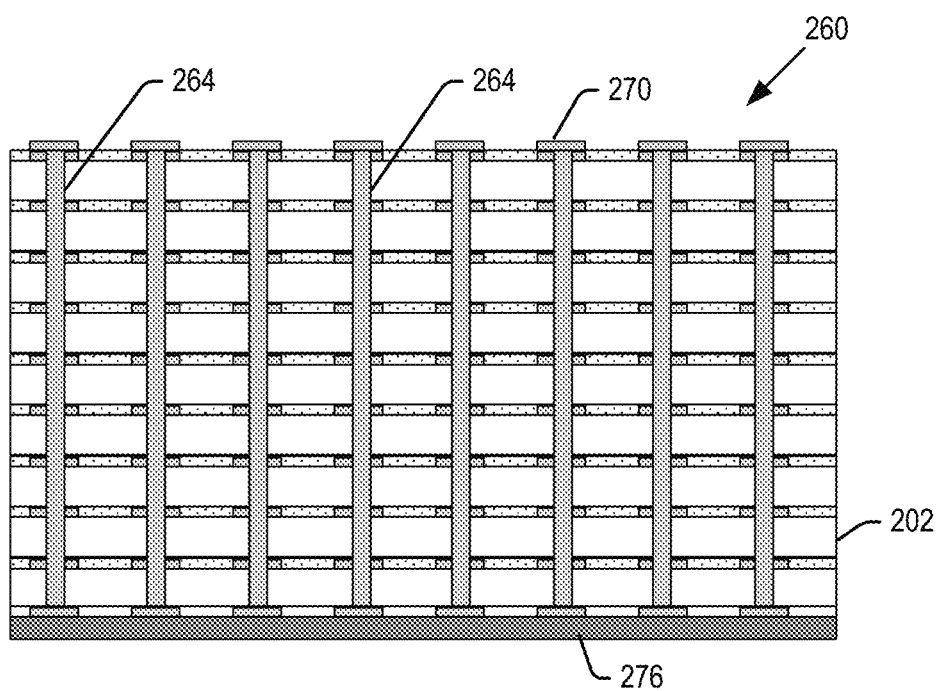

FIGS. 11-20 illustrate the fabrication of a face-up memory module 266, where the contact pads 254 used for external electrical connection of the memory module 266 on a bottom surface 262 of the module. FIGS. 21-23 illustrate a further embodiment of the fabrication of a face-down memory module 266, where the electrical contacts for external electrical connection of the memory module 266 are on an upper surface of the module.

Referring to the flowchart of FIG. 21, the face-down memory module 266 may be formed in the same manner as the face-up memory module in steps 70-88. In particular, a number of memory array wafers 200 may be stacked on a carrier 250, and TSVs 264 may be formed as described above, to the fabrication stage shown in FIG. 17. Thereafter, in step 94, a conductive layer may be applied to and developed into a pattern on an upper surface 272 of the wafer stack. Next, in step 95, contact pads 270 may be plated onto the developed pattern as shown in FIG. 22. The contact pads 270 may be formed over, and electrically coupled to, the bond pads 208.

In step 96, the carrier 250 may be removed as shown in FIG. 23. Thereafter, a polyimide film 276 may be applied to the bottom surface of the memory array wafer stack 260. The polyimide film 276 is provided to seal and protect the lower surface of the wafer stack 260. Thereafter, the memory array wafer stack 260 may be singulated as described above to provide individual completed memory modules 266.

Figure 24:
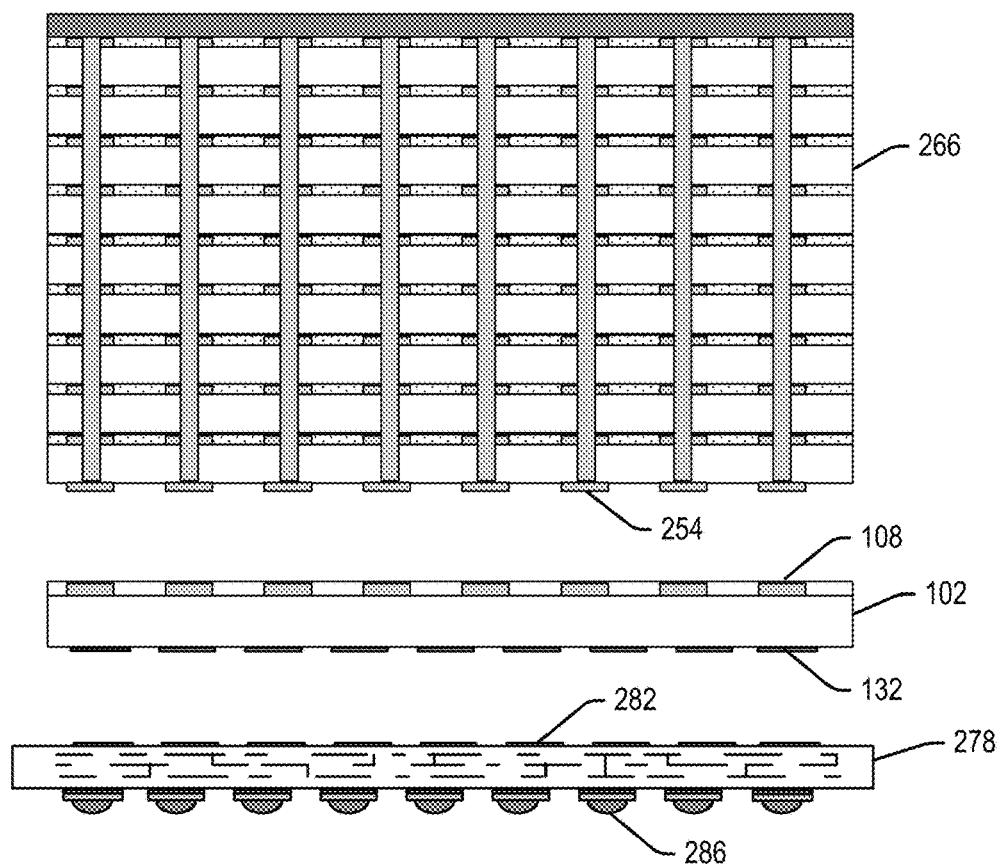
FIG. 24 is an exploded edge view of a semiconductor device including a memory array semiconductor die stack and controller semiconductor die for mounting on a substrate.
Figure 25:
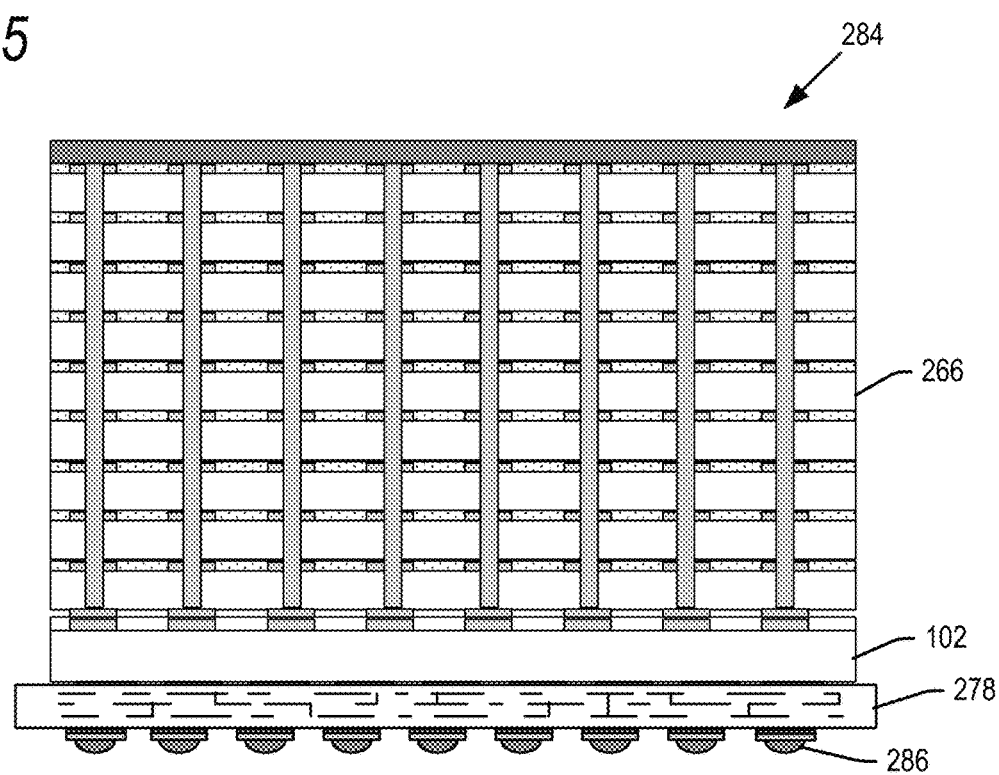
FIG. 25 is an edge view of a completed semiconductor device according to embodiments of the present technology.

Upon completion of the memory module 266 in accordance with any of the above-described embodiments, the memory module 266 may be mounted together with a controller die 102 on a substrate 278 as shown in FIGS. 24 and 25. The face-up TSV configuration may be lowered down onto the controller die 102 (the face-down TSV configuration may be inverted, and then lowered down onto the controller die 102). The contact pads 254 of the memory module 266 may be physically and electrically bonded to the contact pads 108.

Thereafter, the memory module 266 and controller die 102 may be mounted on the substrate 278, with the microbumps 132 of the controller die 102 physically and electrically coupled to contact pads 282 of the substrate to provide a completed semiconductor device 284 as shown in FIG. 25. The device 284 may thereafter be mounted to a host device 300 (FIG. 26), such as for example a printed circuit board, by solder balls 286 on a surface of the substrate 278. The semiconductor device 284 may optionally be encapsulated in a protective mold compound prior to being affixed to the host device 300.

FIG. 26 is a functional block diagram of a semiconductor device 284 according to embodiments of the present technology. As shown, a controller die 102 controls a column of n memory array dies 202 in the memory module 266. Each of the ASIC logic circuit 112, memory array logic circuit 114 and the cache structure 115 are fabricated into a single heterogeneous integrated semiconductor die 102. In FIG. 26, the memory logic array 114 is separated into the memory array logic circuit and memory array analog circuit, with cache structure 115 interfacing between the ASIC logic circuit and both the memory array logic and analog circuits. The ASIC logic circuit 112 communicates with the host device 300 via the host interface. The ASIC logic circuit 112 and memory array logic circuits 114 communicate with the memory module 266 via the memory array interface.

In summary, an example of the present technology relates to a semiconductor device configured to operate with a host device, comprising: a first semiconductor die comprising: an ASIC logic circuit configured to interface with the host device, a memory array logic circuit configured to interface with a memory array, and a cache structure configured to provide storage within the first semiconductor die; and a group of one or more second semiconductor dies coupled to the first semiconductor die, the group of one or more second semiconductor dies comprising the memory array configured to interface with the memory array logic circuit of the first semiconductor die.

In a further example, the present technology relates to a semiconductor device configured to operate with a host device, comprising: a first semiconductor die comprising: an ASIC logic circuit configured to interface with the host device, a memory array logic circuit configured to interface with a memory array, and a cache structure configured to provide storage within the first semiconductor die; a memory module coupled to the first semiconductor die, the memory module comprising a plurality of second semiconductor dies having the memory array; and a plurality of through silicon vias continuously formed through the memory module and comprising an electrical conductor electrically coupling the plurality of second semiconductor dies to each other.

In a further example, the present technology relates to a semiconductor device configured to operate with a host device, comprising: a first semiconductor die comprising: ASIC logic circuit means for interfacing with the host device, memory array logic circuit means for interfacing with a memory array, and cache means for providing storage within the first semiconductor die; a memory module coupled to the first semiconductor die, the memory module comprising a plurality of second semiconductor dies having the memory array; and electrical connector means continuously, formed through the memory module and comprising an electrical conductor, for electrically coupling the plurality of second semiconductor dies to each other.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor device configured to operate with a host device, comprising:
a first semiconductor die comprising:
an ASIC logic circuit configured to interface with the host device,
a memory array logic circuit configured to interface with a memory array, and
a cache structure configured to provide storage within the first semiconductor die; and
a group of one or more second semiconductor dies coupled to the first semiconductor die, the group of one or more second semiconductor dies comprising the memory array configured to interface with the memory array logic circuit of the first semiconductor die.

2. The semiconductor device of claim 1, wherein the ASIC logic circuit, the cache structure and the memory array logic circuit are provided in successive dielectric layers of the first semiconductor die.

3. The semiconductor device of claim 1, wherein cache structure provides temporary input/output storage for the ASIC logic circuit.

4. The semiconductor device of claim 1, wherein the cache structure provides temporary input/output storage for the memory array logic circuit.

5. The semiconductor device of claim 1, wherein the group of one or more second dies comprise a memory module having a plurality of semiconductor dies electrically coupled to each other by through silicon vias.

6. The semiconductor device of claim 5, wherein the through silicon vias are continuously formed.

7. The semiconductor device of claim 6, wherein each of the plurality of semiconductor dies of the memory module comprise bond pads facing a first surface of the memory module, the memory module comprising a face-up memory module having contact pads on a second surface of the memory module opposite the first surface.

8. The semiconductor device of claim 6, wherein each of the plurality of semiconductor dies of the memory module comprise bond pads facing a first surface of the memory module, the memory module comprising a face-down memory module having contact pads on the first surface of the memory module.

9. The semiconductor device of claim 1, wherein the first semiconductor die comprises a set of bond pads on a first surface configured to mate with contacts of the host device, and a set of conductive bumps on a second surface configured to mate with contacts of a memory array die of the group of one or more memory array dies.

10. The semiconductor device of claim 1, wherein the group of one or more second semiconductor dies comprise a three-dimensional stacked memory structure having strings of memory cells formed into layers.

11. A semiconductor device configured to operate with a host device, comprising:
a first semiconductor die comprising:
an ASIC logic circuit configured to interface with the host device,
a memory array logic circuit configured to interface with a memory array, and
a cache structure configured to provide storage within the first semiconductor die;
a memory module coupled to the first semiconductor die, the memory module comprising a plurality of second semiconductor dies having the memory array; and
a plurality of through silicon vias continuously formed through the memory module and comprising an electrical conductor electrically coupling the plurality of second semiconductor dies to each other.

12. The semiconductor device of claim 11, wherein the plurality of second semiconductor dies in the memory module are stacked on each other in a column.

13. The semiconductor device of claim 11, wherein each of the plurality of semiconductor dies of the memory module comprise bond pads facing a first surface of the memory module, the memory module comprising a face-up memory module having contact pads on a second surface of the memory module opposite the first surface.

14. The semiconductor device of claim 11, wherein each of the plurality of semiconductor dies of the memory module comprise bond pads facing a first surface of the memory module, the memory module comprising a face-down memory module having contact pads on the first surface of the memory module.

15. The semiconductor device of claim 11, wherein the ASIC logic circuit, the cache structure and the memory array logic circuit are provided in successive layers of the first semiconductor die.

16. The semiconductor device of claim 11, wherein the cache structure provides temporary input/output storage for the ASIC logic circuit.

17. The semiconductor device of claim 11, wherein the cache structure provides temporary input/output storage for the memory array logic circuit.

18. A semiconductor device configured to operate with a host device, comprising:
a first semiconductor die comprising:

ASIC logic circuit means for interfacing with the host device,
memory array logic circuit means for interfacing with a memory array, and
cache means for providing storage within the first semiconductor die;
a memory module coupled to the first semiconductor die, the memory module comprising a plurality of second semiconductor dies having the memory array; and
electrical connector means continuously, formed through the memory module and comprising an electrical conductor, for electrically coupling the plurality of second semiconductor dies to each other.

19. The semiconductor device of claim 18, wherein each of the plurality of semiconductor dies of the memory module comprise bond pads facing a first surface of the memory module, the memory module comprising a face-up memory module having contact pads on a second surface of the memory module opposite the first surface.

20. The semiconductor device of claim 18, wherein each of the plurality of semiconductor dies of the memory module comprise bond pads facing a first surface of the memory module, the memory module comprising a face-down memory module having contact pads on the first surface of the memory module.

* * * * *